United States Patent
Satoh

(10) Patent No.: US 7,719,372 B2
(45) Date of Patent: May 18, 2010

(54) VOLTAGE CONTROLLED PIEZOELECTRIC OSCILLATOR THAT CAN BE LINEAR FREQUENCY CONTROLLED

(75) Inventor: Tomio Satoh, Hino (JP)

(73) Assignee: Epson Toyocom Corporation, Tokyo (JP)

( * ) Notice: Subject to any disclaimer, the term of this patent is extended or adjusted under 35 U.S.C. 154(b) by 434 days.

(21) Appl. No.: 11/665,043

(22) PCT Filed: Oct. 12, 2005

(86) PCT No.: PCT/JP2005/018819

§ 371 (c)(1),
(2), (4) Date: Apr. 10, 2007

(87) PCT Pub. No.: WO2006/041107

PCT Pub. Date: Apr. 20, 2006

(65) Prior Publication Data

US 2009/0115543 A1    May 7, 2009

(30) Foreign Application Priority Data

Oct. 12, 2004   (JP) .............................. 2004-297668

(51) Int. Cl.
*H03B 5/32* (2006.01)
(52) U.S. Cl. ............. 331/158; 331/116 R; 331/116 FE; 331/34; 331/36 C; 331/177 R
(58) Field of Classification Search ............. 331/177 V, 331/36 C, 34, 177 R, 158, 116 R, 116 FE
See application file for complete search history.

(56) References Cited

U.S. PATENT DOCUMENTS 7,015,768 B1 * 3/2006 Talwalkar ................ 331/177 V
7,292,118 B2 * 11/2007 Suto ....................... 331/177 V

FOREIGN PATENT DOCUMENTS

| JP | 62-90006    | 4/1987 |
| JP | 2-8221      | 1/1990 |
| JP | 4-150506    | 5/1992 |
| JP | 6-45826     | 2/1994 |
| JP | 9-214250    | 8/1997 |
| JP | 10-56330    | 2/1998 |
| JP | 11-068464   | 3/1999 |
| JP | 2001-007649 | 1/2001 |

OTHER PUBLICATIONS

"Voltage Controlled Crystal Oscillator (VCXO)" on pp. 17-18 in the publication "Description and Application of Crystal Device" published in Japan in Mar. 2002 by QIAJ (Quartz Crystal Industry Association of Japan).

* cited by examiner

*Primary Examiner*—Arnold Kinkead
(74) *Attorney, Agent, or Firm*—William L. Androlia; H. Henry Koda

(57) ABSTRACT

A variable capacitance unit that configures a voltage controlled piezoelectric oscillator including a first variable capacitance diode, a first condenser connected in parallel with the first variable capacitance diode, the second variable capacitance diode, a second condenser inserted and connected between a cathode of the first variable capacitance diode and an anode of the second variable capacitance diode, a third condenser inserted and connected between an anode of the first variable capacitance diode and a cathode of the second variable capacitance diode. The external control voltage is applied to the first variable capacitance diode and the second variable capacitance diode so that respective polarities thereof are reversed.

9 Claims, 9 Drawing Sheets

L1: Equivalent inductor of Xtal

C1: Equivalent capacitance of Xtal

C0: Equivalent parallel capacitance of Xtal

Cx: Variable capacitance of oscillation circuit

Cc: Circuit capacitance of oscillation circuit

DL simulation

DL simulation

VOLTAGE CONTROLLED PIEZOELECTRIC OSCILLATOR THAT CAN BE LINEAR FREQUENCY CONTROLLED

TECHNICAL FIELD

The present invention relates to a voltage controlled piezoelectric oscillator that can be linear frequency controlled.

BACKGROUND ART

In the circuit configuration of a piezoelectric oscillator which is a type that changes an oscillation frequency by using a Variable Capacitance Diode, as summarized in a Voltage Controlled Crystal Oscillator (VCXO) on pages 17 to 18 in "Description and Application of Crystal Device (March, 2002)" published by QIAJ (Quartz Crystal Industry Association of Japan), for example, a variable capacitance diode is inserted in an oscillation loop, and a control voltage is externally applied to the variable capacitance diode, whereby a capacitance of the variable capacitance diode is changed. Accordingly, a load capacitance of the oscillation loop is changed so that the frequency is varied.

FIG. 5 shows an example of a circuit in a generally used voltage controlled crystal oscillator, which is also disclosed, for example, in Japanese Patent Application Laid-Open No. 09-214250. An inverter element IC1 is used in the oscillation circuit. A high resistance R1 is inserted between an input and an output of the inverter element IC1, so that an operating point is always set to the center. Between the input and the output of the inverter element IC1, a crystal unit Xtal, and a variable capacitance unit in which a condenser C5 is connected in parallel to a variable capacitance diode D1 are inserted in series, thereby configuring an oscillation loop. The parallel connection of the condenser C5 to the variable capacitance diode D1 allows a variable range to be controlled finely. Furthermore, condensers C1 and C2 are respectively inserted between GND and the input of the inverter element IC1 and between GND and the output thereof.

An external control voltage Vcont is divided by high resistances R2 and R3, and is applied to a cathode of the variable capacitance diode D1. An anode of the variable capacitance diode D1 is connected to GND through a high resistance R4. A capacitance is changed by the voltage between the cathode and the anode of the variable capacitance diode D1, so that a load capacitance of the oscillation loop is changed. As a result, an oscillation frequency is changed. The variable width and the linearity of the frequency can be controlled finely by the high resistance R3 and an element value of the condenser C5.

FIG. 6 is another conventional example used for a high-frequency oscillation, in which two transistors (TR1, TR2) are cascade-connected in an oscillation circuit. Two variable capacitance diodes D1 and D2 are connected in series so as to prevent deterioration in noise characteristic caused by self-modulating due to an oscillating level.

Conventionally, a frequency offset at the time of capacitance loading of the piezoelectric oscillation circuit is approximately given by Equation (1) as $D_L$ (=Fractional Load Resonance Frequency Offset). The equivalent circuit model therefor is shown in FIG. 7. A load capacitance of the oscillation loop (=$C_L$) can be expressed as a configuration in which a circuit load (=$C_c$) and a variable capacitance (=$C_x$) are connected in series.

$$D_L(C_x) \approx \frac{1}{2\gamma} \times \frac{1}{1 + \frac{C_L}{C_0}} \quad \because \frac{1}{C_L} = \frac{1}{C_x} + \frac{1}{C_c} \tag{1}$$

By setting a reference capacitance (=$C_{Lref}$) that gives a nominal frequency, the frequency offset can be expressed by Equation (2).

$$D_{Lref}(C_x) \approx \frac{1}{2\gamma} \times \frac{1}{1 + \frac{C_{Lref}}{C_0}} \tag{2}$$

$\Delta D_L$, an amount of change in frequency from the nominal frequency, is a difference calculated by subtracting Equation (2) from Equation (1). This can be expressed by Equations (3) and (4).

$$\Delta D_L(C_x) \approx D_L(C_x) - D_{Lref}(C_x) \tag{3}$$

$$\Delta D_L(C_x) \approx \frac{1}{2\gamma} \left\{ \frac{1}{1 + \frac{1}{C_0\left(\frac{1}{C_x} + \frac{1}{C_c}\right)}} - \frac{1}{1 + \frac{C_{Lref}}{C_0}} \right\} \tag{4}$$

$$\because \frac{C_L}{C_0} = \frac{1}{\frac{C_0}{C_L}} = \frac{1}{C_0\left(\frac{1}{C_x} + \frac{1}{C_c}\right)}$$

$\gamma$: Capacitance Ratio (=$C_0/C_1$)

Examples of variable capacitance characteristics of the variable capacitance diode are shown in FIGS. 8 and 9. As is apparent from FIGS. 8 and 9, the variable characteristics of the variable capacitance diode can be approximated by Equation (5), and the variable capacitance $C_x$ is obtained in Equation (6).

$$V_{ari}(v) = \alpha \times e^{-nv} \tag{5}$$

$\alpha$: Capacitance when applied voltage is zero n: Gradient $$C_x = V_{ari}(v) + C_b \tag{6}$$

$C_b$: Parallel capacitance of variable capacitance

Substitution of Equation (4) into Equation (6) provides Equation (7), which is a relational expression showing a frequency change and a variable voltage applied by an external control voltage to the variable capacitance diode.

$$\Delta D_L(C(v)) \approx \frac{1}{2\gamma} \left\{ \frac{1}{1 + \frac{1}{C_0\left(\frac{1}{\alpha e^{-nv} + C_b} + \frac{1}{C_c}\right)}} - \frac{1}{1 + \frac{C_{Lref}}{C_0}} \right\} \tag{7}$$

Equation (8) for giving a linear frequency change with respect to the variable voltage is shown blow.

$$\Delta D_L(C(v)) \approx \frac{1}{2\gamma}\left\{\frac{1}{1+\dfrac{1}{C_0\left(\dfrac{1}{C(v)}+\dfrac{1}{C_c}\right)}} - \frac{1}{1+\dfrac{C_{Lref}}{C_0}}\right\} \quad (8)$$

$$= \frac{1}{2\gamma}\{A(v-a))\}$$

A: Gradient of frequency with respect to variable voltage a: Voltage for $\Delta D_L = 0$ by nominal frequency Equation (9) obtained by modifying Equation (8) is shown below. Equation (9) gives the linear frequency change with respect to the variable voltage.

$$C(v) = \frac{1}{\dfrac{1}{C_0}\dfrac{1}{\dfrac{1}{A(v-a)+\dfrac{1}{1+\dfrac{C_{Lref}}{C_0}}}-1} - \dfrac{1}{C_c}} \quad (9)$$

FIG. 10 shows examples of simulation results of Equations (5), (6) and (9).

The crystal unit Xtal is At-Cut, and a resonance frequency thereof is 13 MHz. It should be noted that $C_o$=1.35 pF, $\gamma$=277, and the circuit capacitance $C_c$ is 60 pF. Furthermore, the 3 variable voltage is Vcont±2.5Vdc, and the variable width is $\Delta D_L$±45 ppm.

The variable capacitance C(v) for obtaining a straight line is a curve in which the variable capacitance C(v) is approximately equal to 11.8 pF at 0V, and is approximately equal to 7.5 pF at 5V. A combined capacitance of a variable capacitance diode $V_{bari}$ and a parallel capacitance Cb that show a characteristic very close to that of the same capacitance change is expressed by Equation (10).

$$11.02 \times e^{-0.097v} + 0.6 [pF] \quad (10)$$

The difference in capacitance between the C(v) in this case and the combined capacitance of the variable capacitance diode is approximately equal to or less than 0.3 pF at maximum.

FIG. 11 shows a variable capacitance C(v) for obtaining a straight line, a frequency change by an approximate variable capacitance diode by the combined capacitance, and a difference therebetween. A difference of 1 ppm provides a change of 70 ppm in width. This value is expected to be a value that indicates a compensation limit by the variable capacitance diode.

The results shown in FIG. 12 indicate a capacitance difference in between an ideal capacitance change and an approximate variable capacitance diode, and a frequency deviation by the capacitance difference.

An outline of contents of FIG. 12 is shown in FIG. 13. That is, the most appropriate selection of an "ideal capacitance change for obtaining a straight line" and a "capacitance change of the variable capacitance diode" that follows a log change results in intersections at two points, P1 and P2. This indicates that the optimum characteristic can be obtained in the vicinity thereof, and indicates also a compensation limit.

Patent Document 1: Japanese Patent Application Laid-Open No. 09-214250

Patent Document 2: Japanese Patent Application Laid-Open No. 10-056330

As shown in FIGS. 12 and 13, In conventional frequency control by single-direction voltage control to a variable capacitance diode, there is a limit in an amount of correction for obtaining a straight line.

SUMMARY OF THE INVENTION

Therefore, it is an object of the present invention to configure an approximate curve for obtaining a plurality of intersections with an ideal capacitance change curve for obtaining a linear change, thereby to configure a correction circuit in which a variable capacitance diode for compensating with higher accuracy is used.

In order to solve the above problem, the invention according to is characterized in that a variable capacitance unit that configures a voltage controlled piezoelectric oscillator comprises a first variable capacitance diode, a first condenser connected in parallel with the first variable capacitance diode, the second variable capacitance diode, a second condenser inserted and connected between a cathode of the first variable capacitance diode and an anode of the second variable capacitance diode, a third condenser inserted and connected between an anode of the first variable capacitance diode and a cathode of the second variable capacitance diode. The external control voltage is applied to the first variable capacitance diode and the second variable capacitance diode so that respective polarities thereof are reversed.

The invention according to the second embodiment is characterized in that a plurality of variable capacitance diodes connected in parallel are used as the first variable capacitance diode.

The invention according to the third embodiment is characterized in that a plurality of variable capacitance diodes connected in parallel are used as the second variable capacitance diode.

The invention according to the fourth embodiment is characterized in that a variable capacitance diode is further connected in parallel to the first variable capacitance diode.

The invention according to the fifth embodiment is characterized in that a variable capacitance diode is further connected in parallel to the second variable capacitance diode.

In the conventional correction by a single-direction voltage application to a variable capacitance diode, there are at most two points of intersection between an ideal capacitance variable curve and an approximate variable capacitance diode combined capacitance variable curve, even when the most appropriate constant is set, as shown in FIGS. 12 and 13. In contrast, in the present invention, as shown in FIG. 15, a second variable capacitance diode is provided and a second correction is additionally performed by a reverse voltage application, so that a linear correction for obtaining three points of intersection can be achieved. As a result, a highly accurate correction with a wide variable range is possible.

This technique can be applicable to a Temperature Compensated Crystal Oscillator (TCXO) with high accuracy, and to a Voltage Controlled Crystal Oscillator (VCXO) for obtaining linearity in a wider range. The technique can greatly contribute to performance improvement of a communications device that requires a frequency reference such as a mobile telephone.

BEST MODE FOR CARRYING OUT THE INVENTION

The present invention will be described below in detail based on preferred embodiments.

Figure 1:
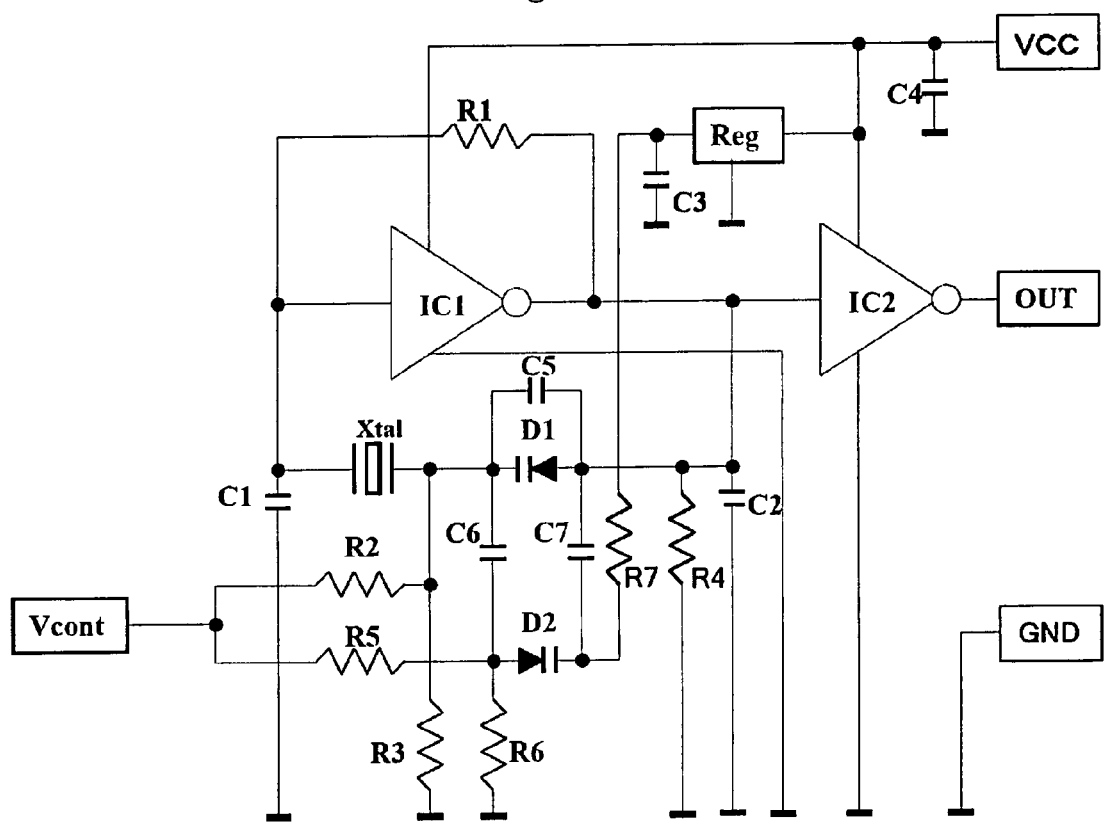
FIG. 1 is a diagram showing an example of a circuit according to the present invention.

FIG. 1 is a circuit diagram showing a first embodiment of a voltage controlled piezoelectric oscillator according to the present invention. Like parts are designated by like reference numerals in the same parts as those in a conventional circuit shown in FIG. 5, and a detailed description thereof will be omitted to avoid redundancies.

Figure 5:
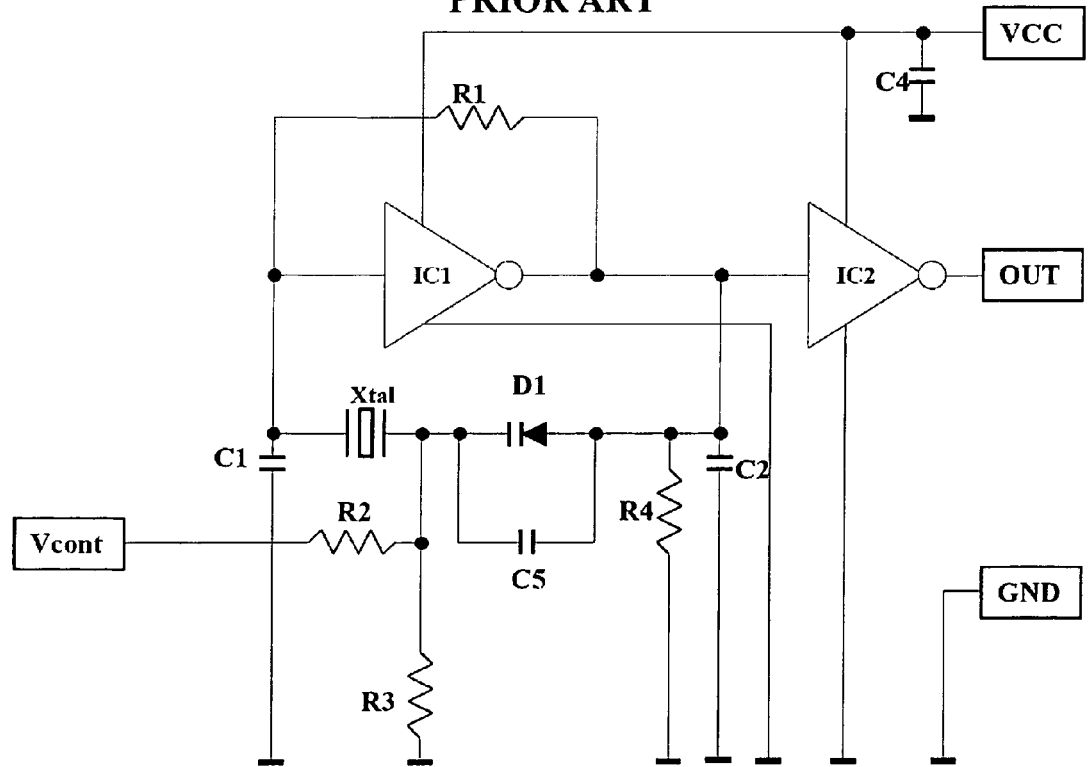
FIG. 5 is a diagram showing an example of a conventional circuit.
Figure 6:
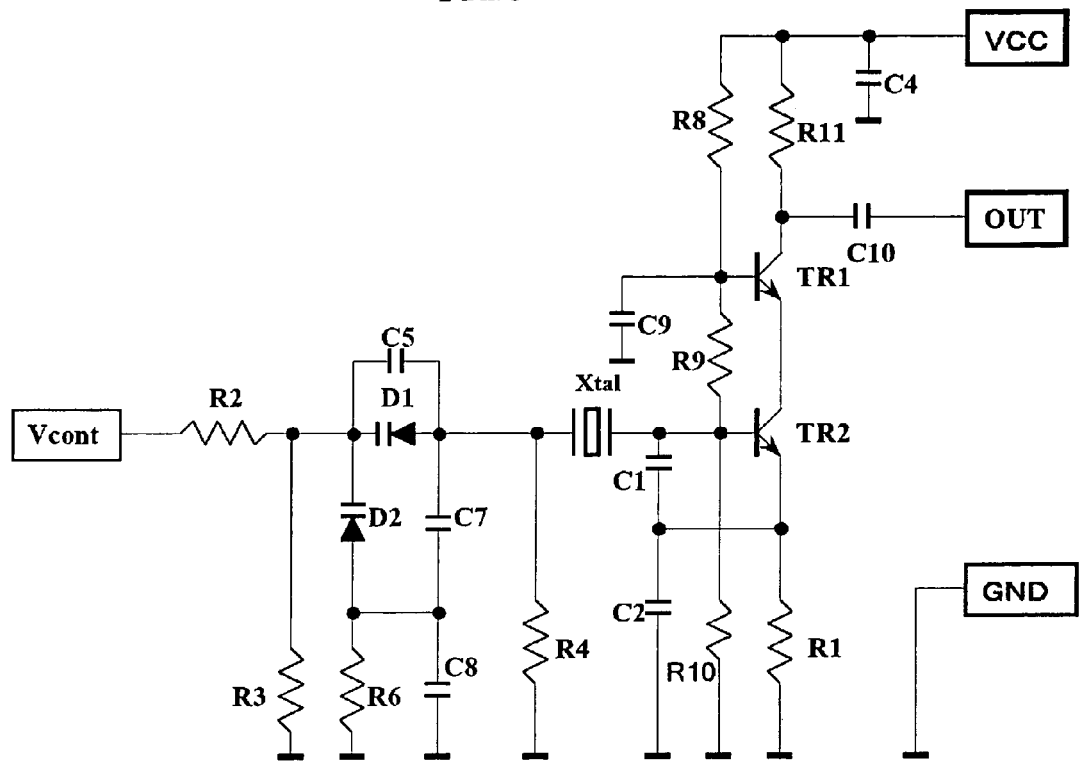
FIG. 6 is a diagram showing an example of the conventional circuit.
Figure 7:
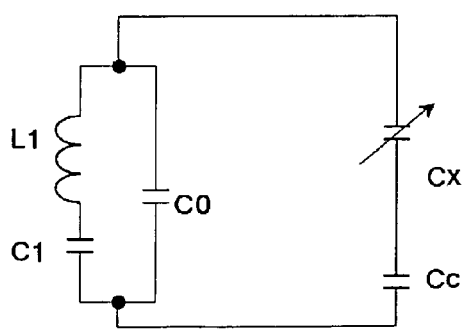
FIG. 7 is a diagram showing a frequency variable equivalent model.
Figure 8:
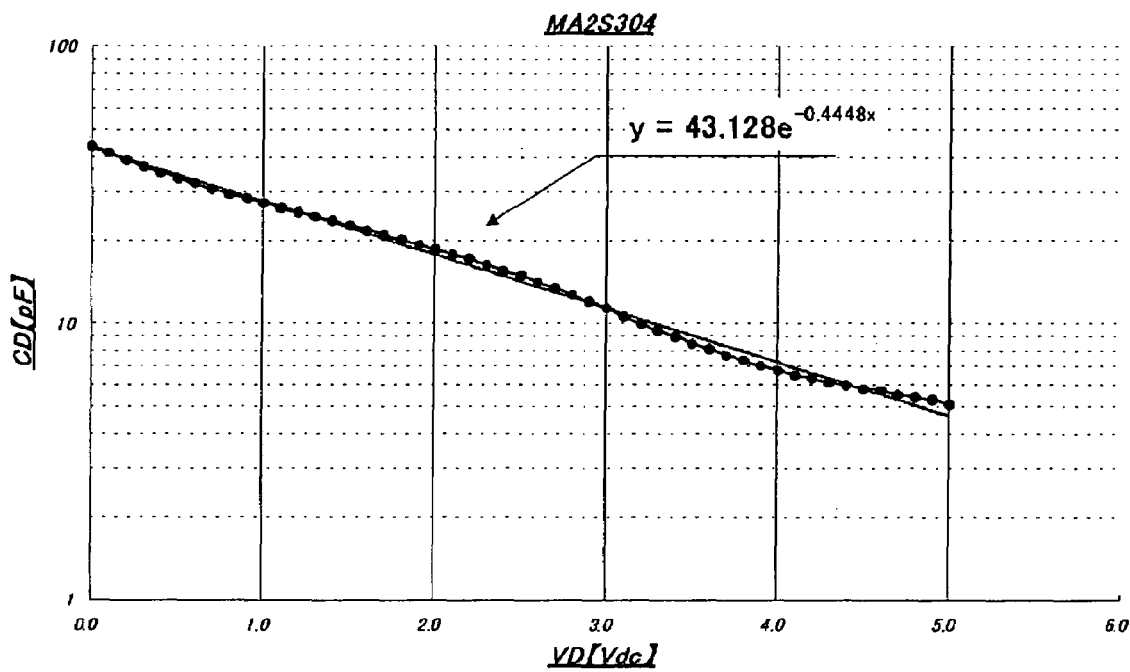
FIG. 8 is a graph showing a characteristic of the variable capacitance diode.
Figure 9:
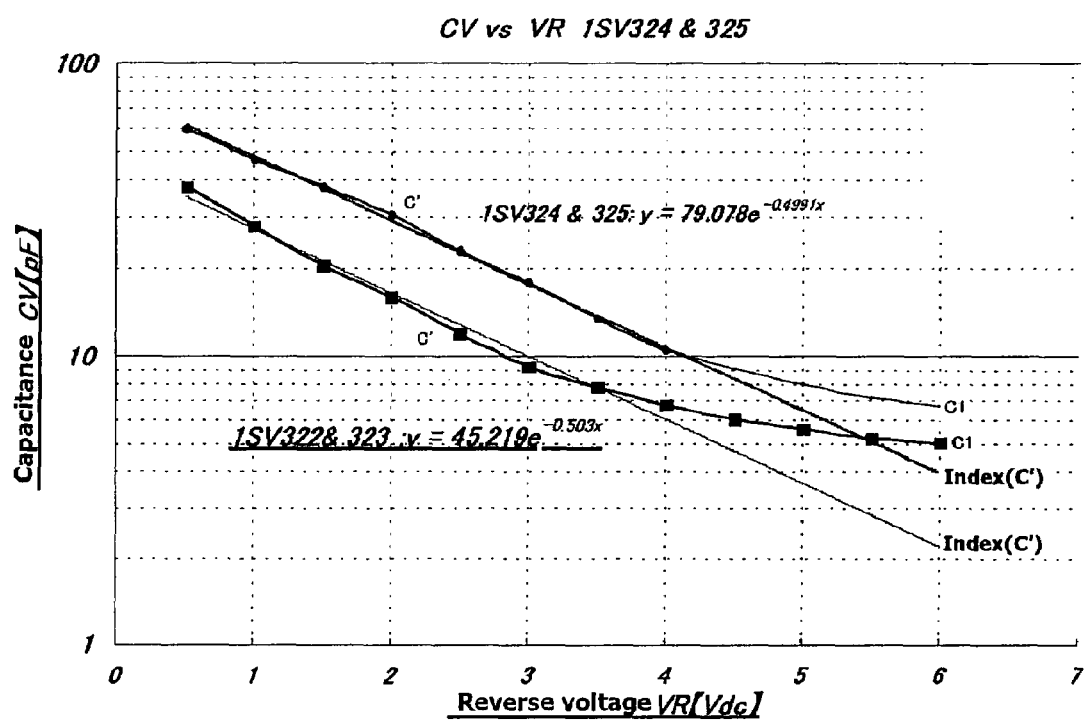
FIG. 9 is a graph showing a characteristic of the variable capacitance diode.
Figure 10:
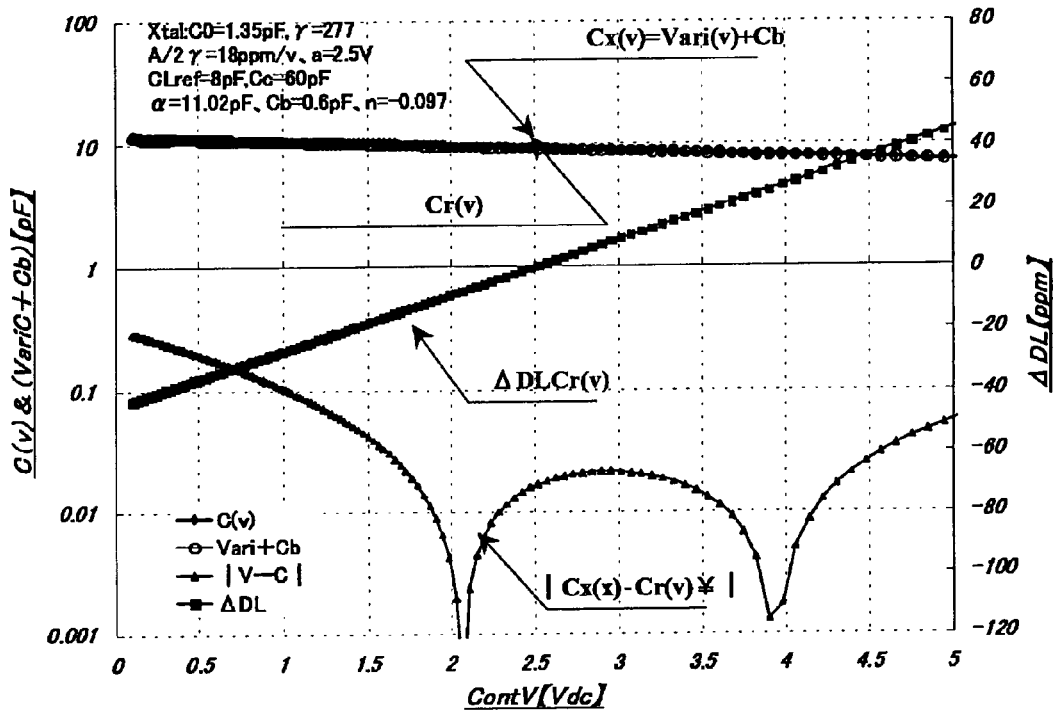
FIG. 10 is a graph showing results of a simulation of the conventional circuit.
Figure 11:
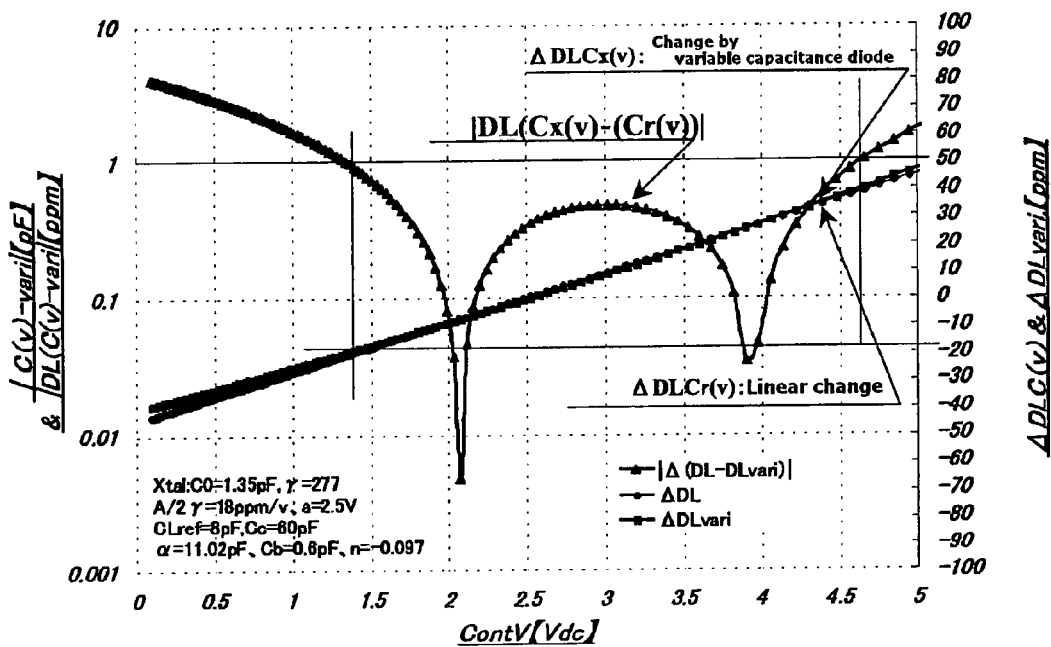
FIG. 11 is a graph showing results of a simulation of the conventional circuit.
Figure 12:
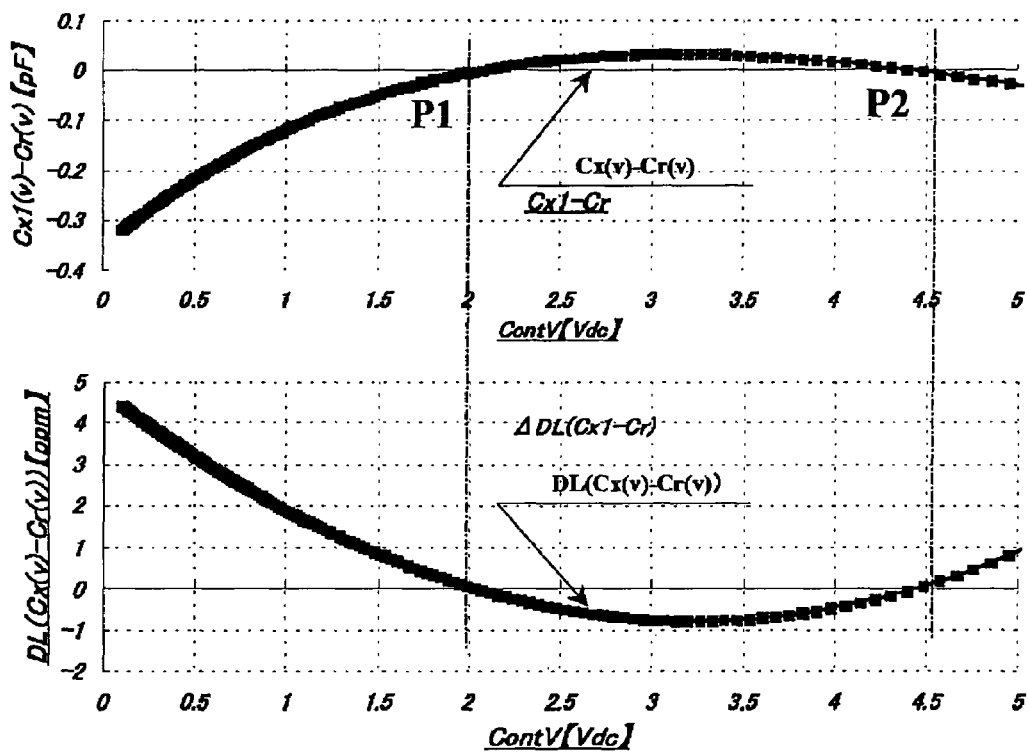
FIG. 12 is a graph showing results of a simulation of the conventional circuit.
Figure 13:
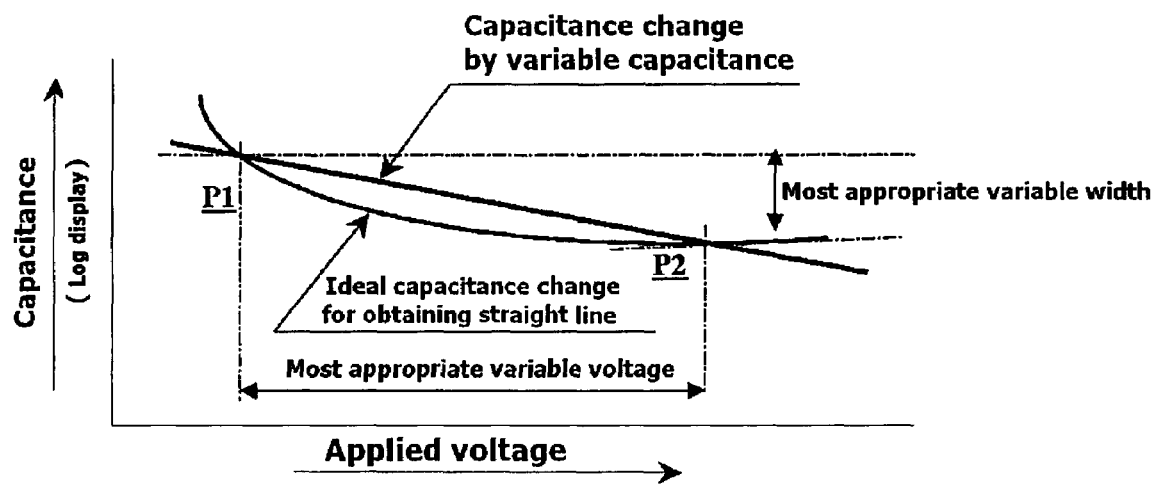
FIG. 13 is an explanatory graph of a capacitance change of the conventional circuit.

In the conventional circuit in FIG. 5, a variable capacitance unit in which a condenser C5 is connected in parallel to a variable capacitance diode D1 to which a crystal unit Xtal is further connected in series is inserted into an oscillation loop. An external control voltage Vcont is divided by high resistances R2 and R3, and applied to a cathode of the variable capacitance diode D1. A capacitance is changed by a voltage change, and an oscillating frequency is controlled.

In contrast, a circuit in FIG. 1 uses a variable capacitance unit in which an anode of a second variable capacitance diode D2 is connected to a cathode of a first variable capacitance diode D1 via a condenser C6, and a cathode of the second variable capacitance diode D2 is connected to an anode of the first variable capacitance diode D1 via a condenser C7. The cathode of the second variable capacitance diode D2 is further connected to a reference power source Reg via a high resistance R7 to be pulled up.

The external control voltage Vcont goes through the resistance R2 and performs a conventional control operation. At the same time, the external control voltage Vcont is divided by high resistances R5 and R6, and applied to the anode of the second variable capacitance diode D2. As a result, an electric potential between the cathode and the anode of the variable capacitance diode D2 decreases according to an increasing control voltage, and the variable capacitance of the variable capacitance diode D2 decreases.

$C_{x1}$, which is a combined capacitance by the variable capacitance unit in which only the conventional variable capacitance diode D1 and the condenser C5 are used, is shown in Equations (11) and (12) as in the case of Equations (5) and (6).

$$V_{ari1}(v) = \alpha \times e^{-nv} \qquad (11)$$

$$C_{x1}(v) = V_{ari1}(v) + C_b \qquad (12)$$

$V_{ari2}$, which is a voltage applied to the second variable capacitance diode D2, is shown in Equation (13). $C_{x2}$, which is a combined capacitance of a series capacitance $C_d$, is given in Equation (14). $C_{x3}$, which is a combined capacitance of $C_{x1}$ and $C_{x2}$, is further given in Equation (15).

$$V_{ari2}(v) = \beta \times e^{-m(v_{ref} - v)} \qquad (13)$$

$V_{ref}$: Reference voltage $$C_{x2}(v) = \cfrac{1}{\cfrac{1}{C_d} + \cfrac{1}{V_{ari2}(v)}} \qquad (14)$$

$C_d$: Capacitance of a connected condenser $$C_{x3}(v) = C_{x1}(v) + C_{x2}(v) = V_{ari1}(v) + C_b + \cfrac{1}{\cfrac{1}{C_d} + \cfrac{1}{V_{ari2}(v)}} \qquad (15)$$

Figure 2:
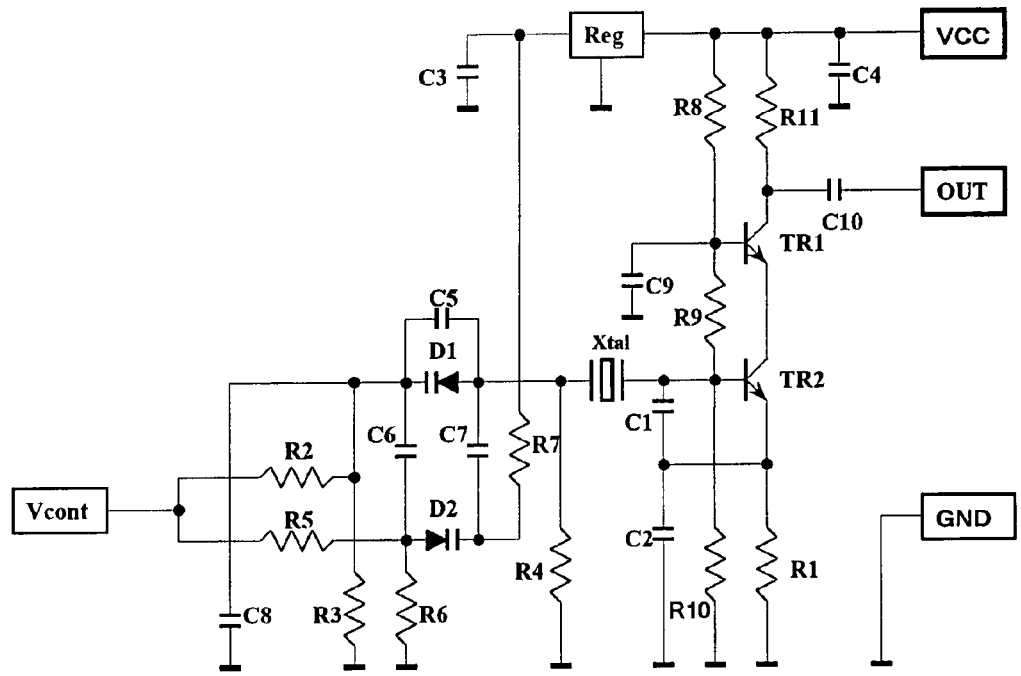
FIG. 2 is a diagram showing an example of the circuit according to the present invention.

FIG. 2 shows a second embodiment. In the second embodiment, the variable capacitance unit according to the present invention is applied to an oscillation circuit in which two transistors are cascade-connected and which is the most often used for a reference oscillation of a mobile telephone or the like. The configuration and the operation of the variable capacitance unit are basically the same as those of the circuit in FIG. 1.

Figure 3:
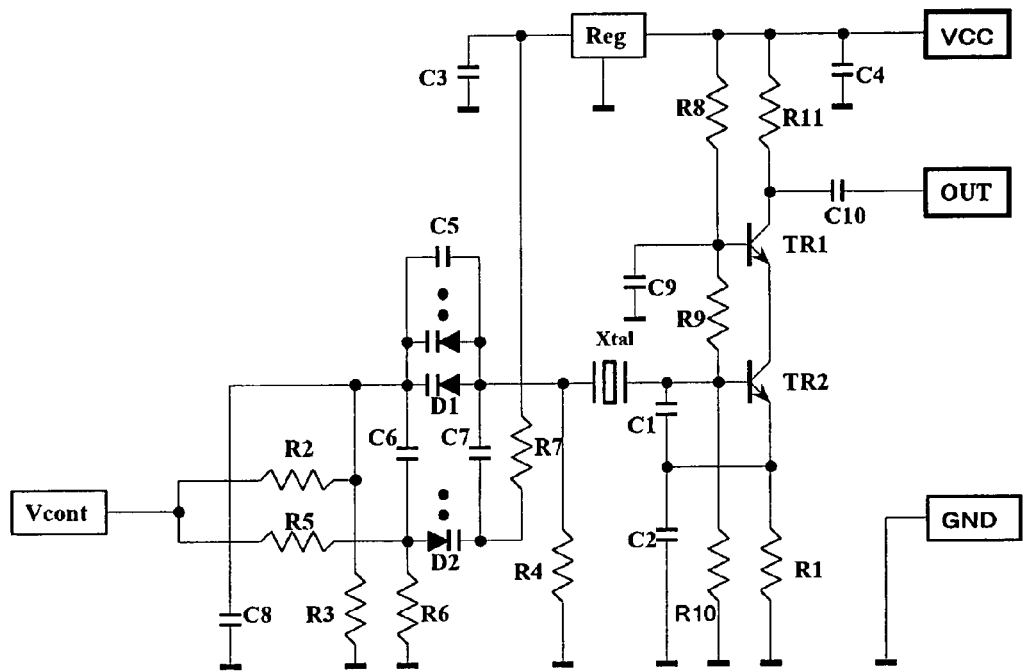
FIG. 3 is a diagram showing an example of the circuit according to the present invention.

FIG. 3 shows a third embodiment. In the third embodiment, a plurality of variable capacitance diodes connected in parallel are arranged and combined as the first and the second variable capacitance diodes, respectively. According to the variable capacitance diodes of this embodiment, a capacitance at the time of zero bias and an amount of change on the control voltage can be adjusted to the appropriate value. That is, by combining a plurality of variable capacitance diodes provided with different characteristics, it becomes possible to obtain an excellent variable capacitance unit that will not be possible with a single variable capacitance diode.

Figure 4:
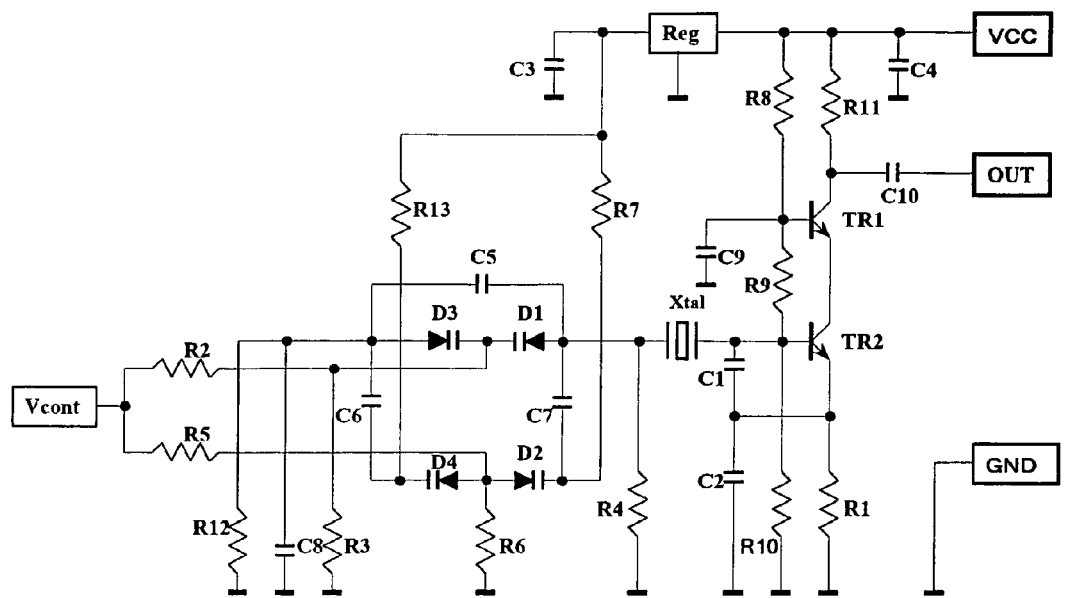
FIG. 4 is a diagram showing an example of a circuit according to the present invention.

FIG. 4 shows a fourth embodiment. According to a configuration of the fourth embodiment in which a plurality of variable capacitance diodes connected in series are arranged and combined as the first and the second variable capacitance diodes, respectively, the appropriate capacitance change on the control voltage can be obtained as in the case of the embodiment in FIG. 3.

Figure 15:
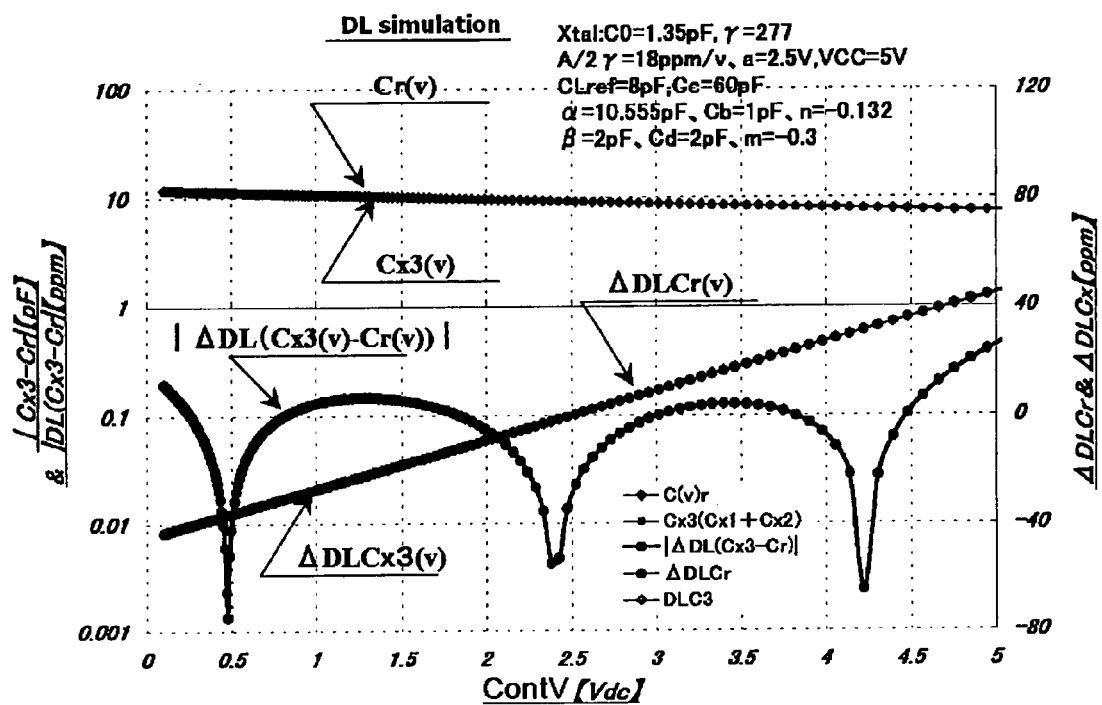
FIG. 15 is a graph showing results of a simulation of the circuit according to the present invention.

FIG. 15 shows an ideal variable capacitance Cr(v) for obtaining a linear change, a characteristic of a combined capacitance $C_{x3}(V)$ according to Equation (15), and an absolute value of a difference between a frequency change and a linear change. Equation (16) shows the combined capacitance $C_{x3}(v)$ according to FIG. 15.

$$C_{x3}(v) = 10.555 \times e^{-1.32v} + 1 + \frac{1}{\frac{1}{2} + \frac{1}{2 \times e^{-0.3v}}} \text{[pF]} \qquad (16)$$

From the absolute value of a difference between a frequency change $DLC_{x3}$ based on the capacitance change expressed by Equation (16) and the linear change, it is possible to keep a deviation within 0.2 ppm from the straight line across the entire variable range of 0V to 5V.

Thus, there are three points of intersection between the straight line and the approximate variable capacitance diode combined capacitance $C_{x3}(v)$.

Figure 16:
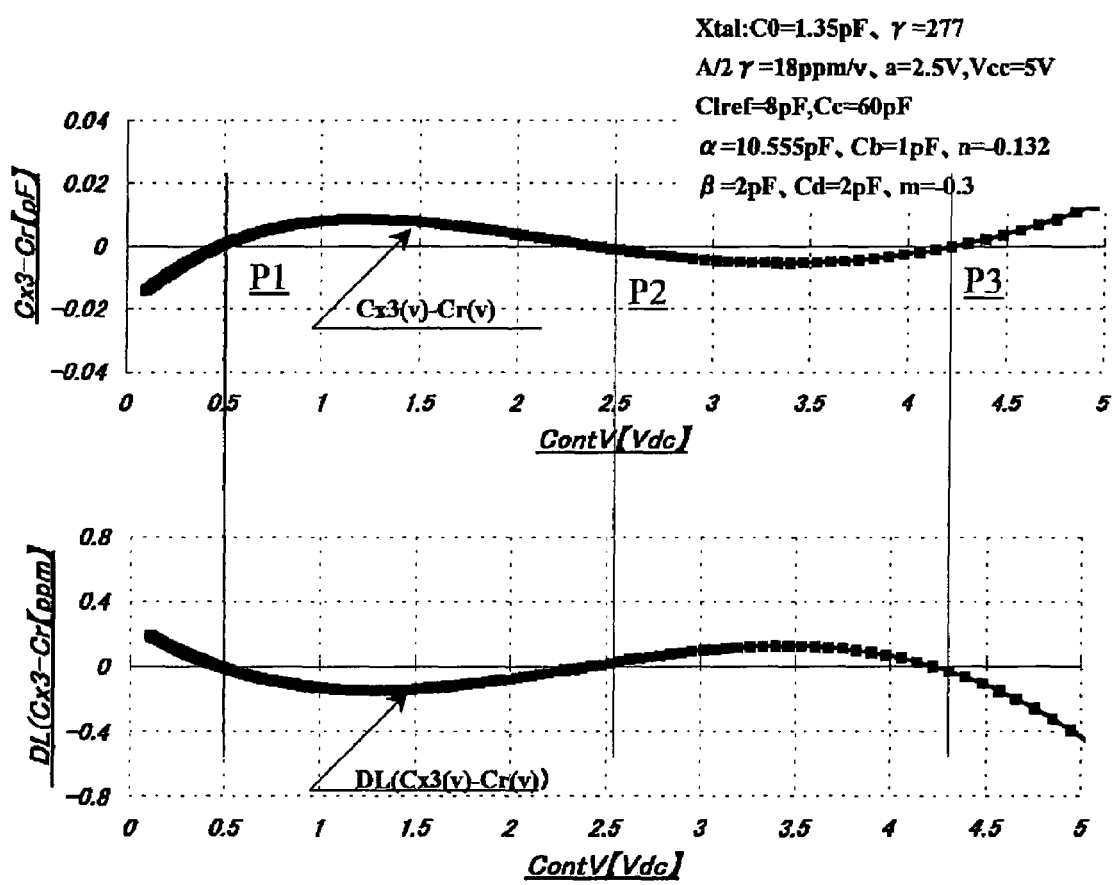
FIG. 16 is a graph showing results of a simulation of the circuit according to the present invention.

FIG. 16 shows a difference between the ideal variable capacitance $Cr(v)$ and the approximate variable capacitance diode combined capacitance change $C_{x3}(v)$, and a difference between a change in linear frequency based on the Cr and a change in frequency based on the $C_{x3}(v)$.

Figure 14:
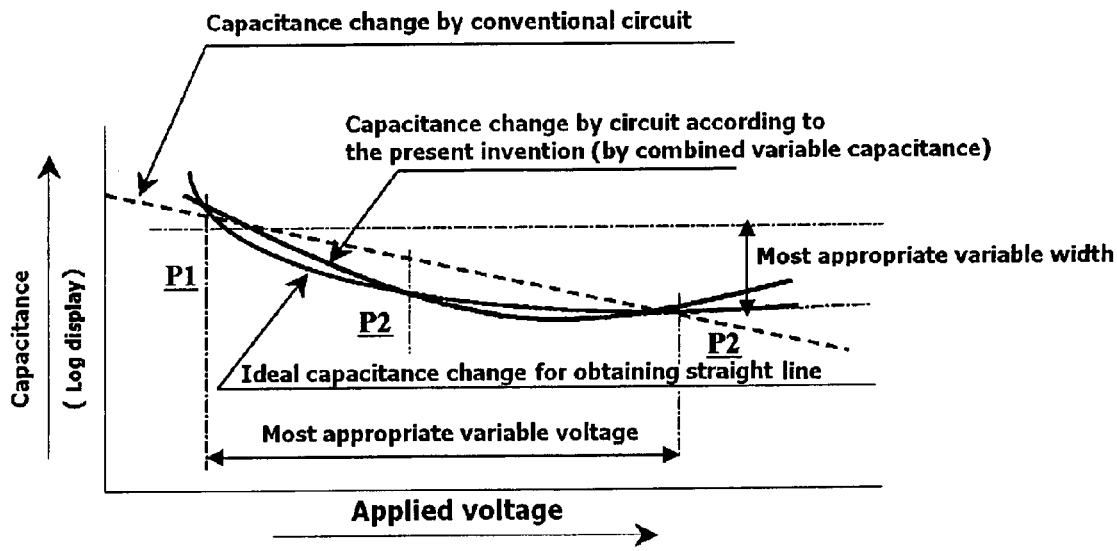
FIG. 14 is an explanatory graph of a capacitance change of the circuit according to the present invention.

Results in FIG. 16 will be described compared with those in FIG. 14. In contrast to the ideal capacitance variable curve for obtaining the straight line, since the conventional single-direction change produces a straight line in a log display as shown by a dotted line, there are two points of intersection. On the other hand, in the present invention, the variable capacitance curve by the combined variable capacitance diodes can produce three points of intersection. Therefore, a linear correction with high accuracy is made possible.

While the present invention has been described by using a so-called VCXO, it is not limited thereto. The present invention can be also applied to an oscillator in which a piezoelectric oscillating device other than a crystal unit can be used as a frequency-determining element. It is needless to say that a variation in which the VCXO is applied to a temperature-compensated piezoelectric oscillator is also included within the scope of the present invention.

The invention claimed is:

1. A voltage controlled piezoelectric oscillator comprising a variable capacitance unit that changes a capacitance value according to an external control voltage, said variable capacitance unit comprising:

a first variable capacitance diode;
a first condenser connected in parallel with said first variable capacitance diode;
a second variable capacitance diode;
a second condenser inserted and connected between a cathode of said first variable capacitance diode and an anode of said second variable capacitance diode;
a third condenser inserted and connected between an anode of said first variable capacitance diode and a cathode of said second variable capacitance diode, wherein
said external control voltage is applied to one end of said first variable capacitance diode and one end of said second variable capacitance diode, respectively, so that said one end of said first variable capacitance diode and said one end of said second variable capacitance diode differ in polarity from each other.

2. A voltage controlled piezoelectric oscillator according to claim 1, wherein a plurality of variable capacitance diodes connected in parallel are used as said first variable capacitance diode.

3. A voltage controlled piezoelectric oscillator according to claim 1 or 2, wherein a plurality of variable capacitance diodes connected in parallel are used as said second variable capacitance diode.

4. A voltage controlled piezoelectric oscillator according to claim 1 or 2, wherein a variable capacitance diode is further connected in parallel to said first variable capacitance diode.

5. A voltage controlled piezoelectric oscillator according to claim 1 or 2, wherein a variable capacitance diode is further connected in parallel to said second variable capacitance diode.

6. A voltage controlled piezoelectric oscillator according to claim 3, wherein a variable capacitance diode is further connected in parallel to said first variable capacitance diode.

7. A voltage controlled piezoelectric oscillator according to claim 3, wherein a variable capacitance diode is further connected in parallel to said second variable capacitance diode.

8. A voltage controlled piezoelectric oscillator according to claim 4, wherein a variable capacitance diode is further connected in parallel to said second variable capacitance diode.

9. A voltage controlled piezoelectric oscillator according to claim 6, wherein a variable capacitance diode is further connected in parallel to said second variable capacitance diode.

* * * * *